US012342575B2

(12) United States Patent
Han

(10) Patent No.: US 12,342,575 B2
(45) Date of Patent: Jun. 24, 2025

(54) SEMICONDUCTOR STRUCTURE AND METHOD MAKING THE SAME

(71) Applicant: ChangXin Memory Technologies, Inc., Hefei (CN)

(72) Inventor: Qinghua Han, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 512 days.

(21) Appl. No.: 17/714,255

(22) Filed: Apr. 6, 2022

(65) Prior Publication Data
US 2023/0065044 A1 Mar. 2, 2023

(30) Foreign Application Priority Data

Aug. 24, 2021 (CN) .......................... 202110973478.2

(51) Int. Cl.
H01L 21/82 (2006.01)
H10D 30/67 (2025.01)
H10D 84/01 (2025.01)
H10D 84/03 (2025.01)

(52) U.S. Cl.
CPC ....... H10D 30/6735 (2025.01); H10D 84/013 (2025.01); H10D 84/016 (2025.01); H10D 84/038 (2025.01)

(58) Field of Classification Search
None
See application file for complete search history.

(56) References Cited

U.S. PATENT DOCUMENTS

| 6,251,712 B1* | 6/2001 | Tanaka ............... H01L 29/78621 438/154 |
| 10,236,214 B2 | 3/2019 | Cheng et al. |
| 2008/0083963 A1* | 4/2008 | Hsu ..................... H01L 27/1446 257/431 |
| 2009/0057722 A1* | 3/2009 | Masuoka ............ H01L 27/1203 257/E27.07 |
| 2014/0284737 A1* | 9/2014 | Kumura ................. H10B 61/22 257/421 |
| 2021/0193527 A1 | 6/2021 | Reznicek et al. |
| 2021/0202743 A1 | 7/2021 | Chiang et al. |
| 2023/0371242 A1* | 11/2023 | Kang ................. H01L 29/66969 |
| 2024/0274684 A1* | 8/2024 | Shao .................... H10D 64/666 |

* cited by examiner

Primary Examiner — Bradley Smith
(74) Attorney, Agent, or Firm — Kilpatrick Townsend & Stockton LLP

(57) ABSTRACT

The invention provides a semiconductor structure and a manufacturing method making the semiconductor structure. The method includes: providing a substrate; forming semiconductor pillars on the substrate; forming gate electrodes on the middle sidewalls of the semiconductor pillars; and performing dopant implantation to form source and drain regions. Since the gate-all-around (GAA) gates surrounding the semiconductor pillars are formed first, and the source region and the drain region are formed later by doping implantation, the precise position of the doping implantation can be ensured, thereby improving the fabrication accuracy of the semiconductor structure and improving the performance of the semiconductor structure.

17 Claims, 12 Drawing Sheets

SEMICONDUCTOR STRUCTURE AND METHOD MAKING THE SAME

TECHNICAL FIELD

The present invention relates to the technical field of semiconductors, and in particular, to a semiconductor structure and a method for fabricating the semiconductor structure.

BACKGROUND

With the continuous increase of the integration level in the semiconductor manufacturing process, improving the integration density of the memory chips is the trend.

Dynamic random access memory (DRAM) is a kind of semiconductor memory device, this type of devices includes transistors. These transistors usually involve planar structures in the related art, while the vertical transistor structure are only used in a relatively small area of applications due to their high process difficulty.

SUMMARY

The present invention provides a semiconductor structure and a method for fabricating the semiconductor structure, to improve the performance of the semiconductor structure.

A method for fabricating a semiconductor structure is provided according to the first embodiment of the present disclosure. The method comprises:
provide a substrate;
forming semiconductor pillars on the substrate;
forming a gate on the middle sidewalls of each of the semiconductor pillars;
performing implantation into the upper and lower portions of each of the semiconductor pillars where the gate is formed, with dopants of the opposite type from those in the semiconductor pillars, to form source and drain regions.

In one embodiment of the present invention, the semiconductor pillars are made of p-type semiconductor material, and n-type doping implantation is performed on the upper and lower parts of the semiconductor pillars; or, the semiconductor pillars is made of n-type semiconductor material, and p-type doping is performed on the upper and lower parts of the semiconductor pillars.

In one embodiment of the present invention, the upper and lower portions of the semiconductor pillars are doped using plasma doping.

In one embodiment of the present invention, the method for fabricating a semiconductor structure further includes:
After the upper and lower portions of the semiconductor pillars are doped with plasma doping, an annealing treatment is performed.

In one embodiment of the present invention, the gates are all around gates.

In one embodiment of the present invention, a bit line is formed in the substrate, and the semiconductor pillars are disposed on the bit line. The method for fabricating the semiconductor structure further includes:
forming the bit line metal silicide within the substrate, after forming the semiconductor pillars and before forming the gates.

In one embodiment of the present invention, the method for fabricating a semiconductor structure further includes:
before forming the bit line metal silicide, forming the sidewall protection layer on the sidewalls of the semiconductor pillars.

In one embodiment of the present invention, after forming the sidewall protection layer, a metal material is deposited in the substrate and annealed to form a bit line metal silicide.

In an embodiment of the present invention, a first trench and a second trench are formed on the substrate along the first direction and the second direction respectively, so as to form a plurality of independently arranged semiconductor pillars, and bit lines extending along the first directions in the substrate and the semiconductor pillars are located on the bit line.

Wherein, the depth of the first trench is greater than the depth of the second trench.

In one embodiment of the present invention, the first direction is perpendicular to the second direction.

In one embodiment of the present invention, the gate includes a gate barrier layer and a gate metal layer sequentially formed on the semiconductor pillars.

In one embodiment of the present invention, forming gates on the sidewalls of the semiconductor pillars includes:
forming a sidewall protection layer on the sidewalls of each of the semiconductor pillars;
forming a barrier layer on the sidewall protection layer;
partially etch the sidewall protection layer to expose the upper and middle portions of the semiconductor pillars; and
form a gate barrier layer and a gate metal layer in the middle of the semiconductor pillars.

In one embodiment of the present invention, the gate barrier layer is formed on the upper sidewalls and the middle sidewalls of the semiconductor pillars, the gate metal layer is formed on the gate barrier layer, and the gate metal layer is removed from the upper sidewalls of the gate barrier layer, and the gate barrier layer is removed from the upper sidewalls of the semiconductor pillars. Then the remaining gate barrier layer and the gate metal layer are used as gate electrodes.

In an embodiment of the present invention, before performing doping implantation on the upper and lower portions of the semiconductor pillars, the method further includes:
removing sidewall protection layer and barrier layer.

In one embodiment of the present invention, the sidewall protection layer and the barrier layer are removed using an ion beam etching process.

In one embodiment of the present invention, forming the sidewall protection layer includes:
forming an initial protective layer on the substrate, wherein the initial protective layer buries the semiconductor pillars;
removing part of the initial protective layer, such that the initial protective layer covering the semiconductor pillars serves as a sidewall protective layer.

In an embodiment of the present invention, after doping implantation in the upper and lower portions of the semiconductor pillars, the method further includes:
forming a termination protection layer between adjacent semiconductor pillars to bury the semiconductor pillars and the gates;
Herein, the termination protective layer is located on the initial protective layer at the lower portions of the semiconductor pillars.

A semiconductor structure is provided according to the second embodiment of the present invention. The semiconductor structure is fabricated by the above-mentioned method.

In one example of the present invention, the cell size of one semiconductor pillar on the substrate is greater than or equal to 4 times the square of the smallest feature size.

The method for fabricating a semiconductor structure according to one embodiment of the present invention include forming vertical semiconductor pillars on a substrate, and forming gates on the middle portion of the sidewalls of the semiconductor pillars, so that the gates protect the middle sidewalls of the semiconductor pillars. The gates are used as masks to realize doping in the upper and lower portions of the semiconductor pillars being opposite type from the doping in the semiconductor pillars, therefore, to form vertical transistors. Since the gates surrounding the semiconductor pillars are formed first, the source region and the drain region are formed later by doping implantation, the precise positions of the doping implantation can be ensured, thereby realizing the fabrication accuracy of the semiconductor structures and improving the performance of the semiconductor devices.

BRIEF DESCRIPTION OF THE DRAWINGS

Various objects, features and advantages of the present invention will become more apparent from consideration of the following detailed description of the preferred embodiments of the present invention in conjunction with the accompanying drawings. The drawings are merely exemplary illustrations of the invention and are not necessarily drawn to scale. Throughout the drawings, the same reference numerals refer to the same or like parts.

Figure 1:
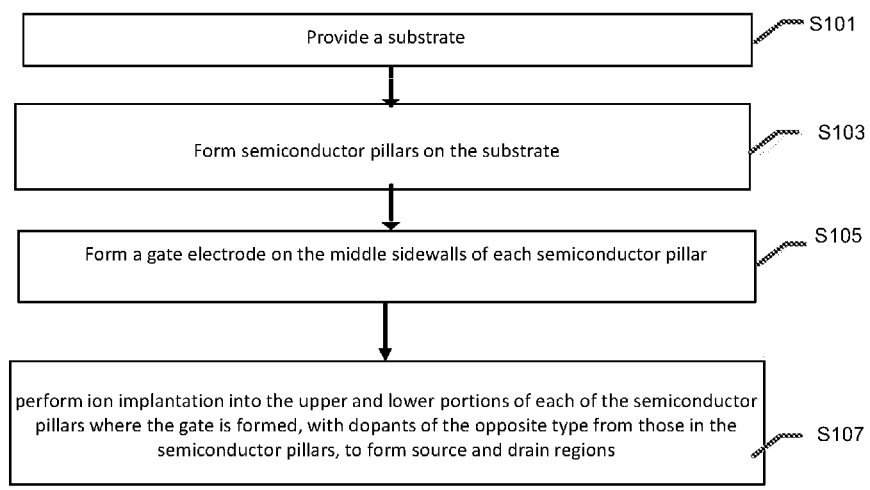
FIG. 1 is a schematic flowchart of a method for fabricating a semiconductor structure according to an exemplary embodiment.

The reference numerals are explained as follows:

10, substrate; 20, bit line; 21, metal silicide; 30, vertical transistor; 31, semiconductor pillar; 311, source region; 312, drain region; 313, channel region; 32, gate; 321, gate barrier layer; 322, gate metal layer;

50; sidewall protective layer; 51, barrier layer; 52, initial protective layer; 53, termination protective layer.

DETAILED DESCRIPTION OF THE PREFERRED EMBODIMENTS

Exemplary embodiments disclosing the features and advantages of the present invention will be described in detail in the following description. It should be understood that the present invention can have various changes in different embodiments without departing from the scope of the present invention, and the descriptions and accompanying drawings are essentially for illustration purposes, rather than for limiting the present invention.

In the following description of various exemplary embodiments of the present disclosure, reference is made to the accompanying drawings, which form a part hereof, and in which are shown by way of example various exemplary structures, systems, and steps in which various aspects of the present disclosure may be implemented. It is to be understood that other specific arrangements of components, structures, exemplary devices, systems and steps may be utilized and structural and functional modifications may be made without departing from the scope of the present disclosure. Furthermore, although the terms "on," "between," "within," etc. may be used in this specification to describe various exemplary features and elements of the present disclosure, these terms are used herein for convenience only, such as the orientation of the examples in the drawings. Nothing in this specification should be construed as requiring a specific three-dimensional orientation of a structure to fall within the scope of this disclosure.

An embodiment of the present invention provides a method for fabricating a semiconductor structure. Please refer to FIG. 1. The method for fabricating a semiconductor structure includes:

S101, providing a substrate 10;

S103, forming pillars on the substrate 10;

S105, forming the gate electrode 32 on the middle sidewalls of each of the semiconductor pillars 31;

S107, performing doping implantation into the upper and lower portions of each of the semiconductor pillars 31 where the gate electrodes 32 are formed, with dopants of the opposite type from those in the semiconductor pillars 31, to form the source region 311 and the drain region 312.

In the method for fabricating a semiconductor structure according to an embodiment of the present invention, semiconductor pillars 31 are formed on the substrate 10, and gate electrodes 32 are formed on the middle sidewalls of the semiconductor pillars 31 such the gate electrodes 32 can protect the middle sidewalls of the semiconductor pillars 31 by contacting, by using the gate electrodes 32 as masks, the upper and lower portions of the semiconductor pillars 31 are implanted with the opposite type of dopants from those in the semiconductor pillars 31, thereby forming the vertical transistors 30. Since the gate electrodes 32 surrounding the semiconductor pillars 31 are formed first, the source regions 311 and the drain regions 312 are formed by the doping implantation, the precise position of the doping implantation can be ensured, thereby improving the fabrication accuracy of the semiconductor structure, thereby improving the semiconductor structure. performance of the structure.

It should be noted that the semiconductor pillars 31 formed on the substrate 10 are perpendicular to the substrate 10, and the independent semiconductor pillars 31 are formed on the substrate 10 at intervals. The middle portions of the semiconductor pillars 31 are the channel regions 313, and each gate electrode 32 surrounds the channel region 313, and one of the upper and lower portions of each semiconductor pillar 31 is the source region 311 and the other is the drain region 312, that is, the channel region 313 is located between the source region 311 and the drain region 312. Before doping and implanting the semiconductor pillars 31, the sidewalls of the semiconductor pillars 31 are exposed, if the exposed semiconductor pillars 31 are directly implanted, the problem of inaccurate implantation will likely occur. The gate electrodes 32 are formed in the middle of the pillar 31 to surround the channel region 313, so that only the upper and lower parts of the semiconductor pillars 31 can be exposed, when doping implantation is performed, so that the gate electrodes 32 serve as masks, to ensure accurate doping implantation without deviating from the upper and lower portions of the semiconductor pillars 31, so reliable source regions 311 and drain regions 312 can be formed.

In one embodiment, the semiconductor pillars 31 are of the p-type semiconductor material, and n-type dopant implantation is performed on the upper and lower parts of the semiconductor pillars 31 to form n-type vertical transistors. The n-type dopants include n-type ions, which may include phosphorus (P), arsenic (As), antimony (Sb), and the like.

In one embodiment, the semiconductor pillars 31 are of n-type semiconductor material, and p-type dopant implantation is performed on the upper and lower parts of the semiconductor pillars 31 to form p-type vertical transistor, and the p-type dopant includes p-type ions, which may include boron (B) or indium (In) and the like.

It should be noted that the vertical transistors 30 in this embodiment may be n-type vertical storage transistors, or p-type vertical storage transistors. In some embodiments, the semiconductor structures formed by the above fabrication method include both n-type vertical memory transistors and p-type vertical memory transistors.

In one embodiment, the upper and lower portions of the semiconductor pillars 31 are doped with the plasma doping process to form the source regions 311 and the drain regions 312. In general that plasma doping is isotropic, the upper and lower sidewalls of the semiconductor pillars 31 can be accurately doped by plasma doping after the gate electrodes 32 are formed in the middle of the semiconductor pillars 31.

Optionally, the manufacturing method of the semiconductor structures further includes: after doping the upper and lower parts of the semiconductor pillars 31 by plasma doping, annealing is performed, so as to ensure that the doping ions of the upper and lower sidewalls of the semiconductor pillars 31 can be redistributed to the desired doping depth from the high temperature thermal diffusion.

Specifically as an example, semiconductor pillars 31 of p-type semiconductor material are implanted with n-type doping on the upper and lower sidewalls of the semiconductor pillar 31 by plasma doping, the annealing furnace can be set at high enough temperature, so that dopants in the source regions 311 and the drain regions 312 are redistributed in the high temperature thermal diffusion, to increase the doping depth of the source regions 311 and the doping depth of the drain regions 312. Optionally, the furnace temperature may be set in a range of 800° C.-1200° C., and the time may be set in a range of 50 min-100 min. In some embodiments, other annealing process can also be used, such as rapid thermal annealing, so as to ensure the diffusion ability of ions.

Optionally, the doping depth of the upper and lower sidewalls of the semiconductor pillars 31 is greater than 5 nm.

In one embodiment, the gate electrodes 32 are Gate-All-Around (GAA), which can effectively protect the middle sidewalls of the semiconductor pillars 31 and avoid implantation deviation during subsequent doping. Therefore, the precise position of doping implantation can be ensured, and the fabrication precision of the semiconductor structures can be improved.

In some embodiments, it does not exclude the situation that the gate electrodes 32 are not Gate-All-Around gates, that is, the gate electrodes 32 may expose some part of the middle sidewalls of the semiconductor pillars 31, can also avoid doping implantation into the exposed middle part of the semiconductor pillars 31 and ensure obtaining the precise location of the dopant implantation. However it should be noted that the control ability to the electric field in the channel of the Gate-All-Around gate is greatly improved compared with the non-Gate-All-Around gates, because the upper and lower parts of the semiconductor pillars 31 can be doped with plasma doping in the subsequent use, without selective implantation, thereby improving the fabrication efficiency of the semiconductor structures.

In one embodiment, the bit lines 20 are formed in the substrate 10, and the semiconductor pillars 31 are located on the bit lines 20. The method for fabricating the semiconductor structures further includes, after forming the semiconductor pillars 31 and before forming the gate electrodes 32, forming bit line metal silicide 21 of the bit lines 20 in the substrate 10 to meet the storage requirements of the semiconductor structures.

Specifically, the bit lines 20 are buried. Before forming the bit line metal silicide 21, it is ensured that the gate electrodes 32 on the semiconductor pillars 31 are not formed, to prevent the gate electrodes 32 from being damaged when the bit line metal silicide 21 is formed. Optionally, the bit line metal silicide 21 may include, but is not limited to, at least one of nickel silicide, platinum silicide, and cobalt silicide.

The deposition of the metal material is performed in the substrate 10 on which the semiconductor pillars 31 are formed, so that the metal material reacts with the silicon in the substrate 10 to form the bit line metal silicide 21. The metal material can be deposited by using a physical vapor deposition process, a chemical vapor deposition process, or an atomic layer deposition process, and the metal material can include one or more of metals such as nickel, platinum, and cobalt. Optionally, after the deposition of the metal material is performed in the substrate 10, an annealing process is performed to form the bit line metal silicide 21. The annealing treatment can be carried out by high temperature furnace or by an annealing method such as rapid thermal annealing.

In one embodiment, the method for fabricating the semiconductor structure further includes: before forming the bit line metal silicide 21, forming a sidewall protection layer 50 on the sidewalls of the semiconductor pillars 31, and the sidewall protection layer 50 is used to realize the protection of the semiconductor pillars 31 to prevent the metal material from being deposited into the semiconductor pillars 31 when the metal material is deposited in the substrate 10.

In one embodiment, the substrate 10 is cut to form the first trench and the second trench along the first direction and the second direction respectively, to form independently arranged semiconductor pillars 31. Bit lines 20 are formed in the substrate 10 extending along the first direction, and the semiconductor pillars 31 are located on the bit lines 20. The depth of the cut along the first direction in the substrate 10 is greater than the depth of the cut along the second direction in the substrate 10. The depth of the first trench is greater than the depth of the second trench. The first trenches may be STI trench.

Figure 2:
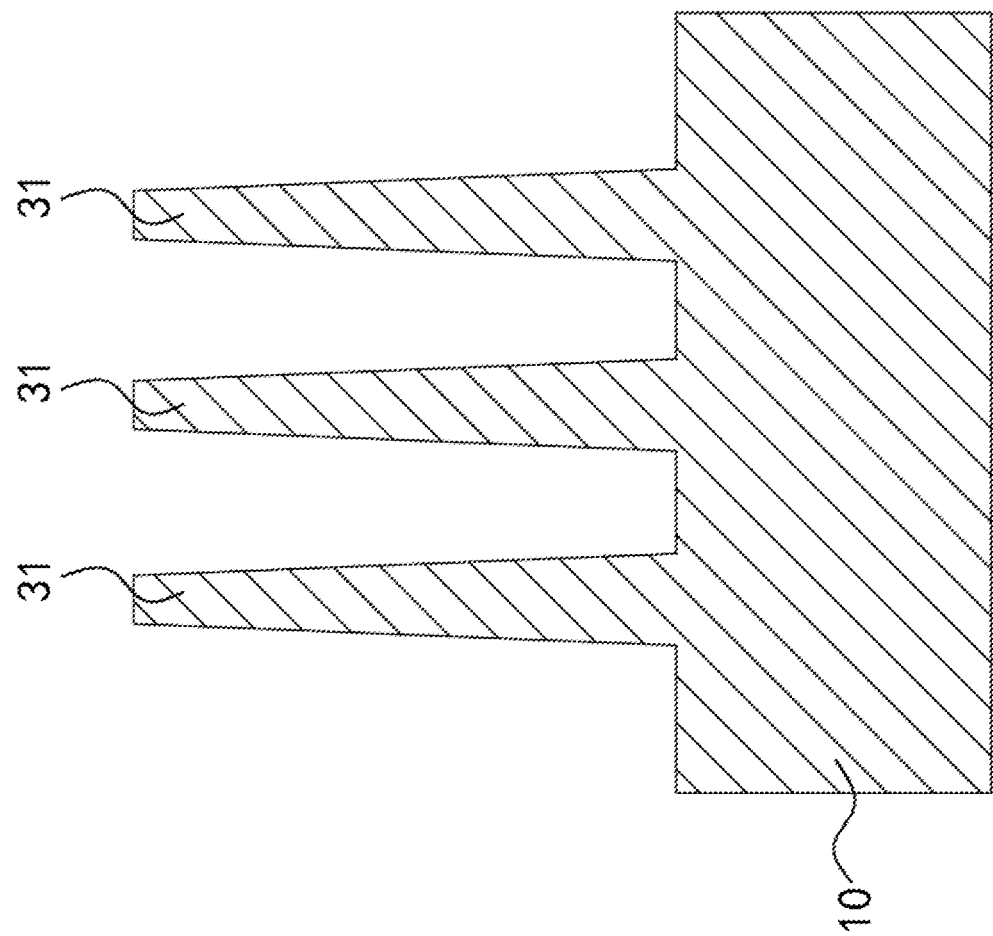
FIG. 2 is a schematic cross-sectional structure diagram of a semiconductor pillars formed along a first direction according to a method for fabricating the semiconductor structure, according to an exemplary embodiment.
Figure 3:
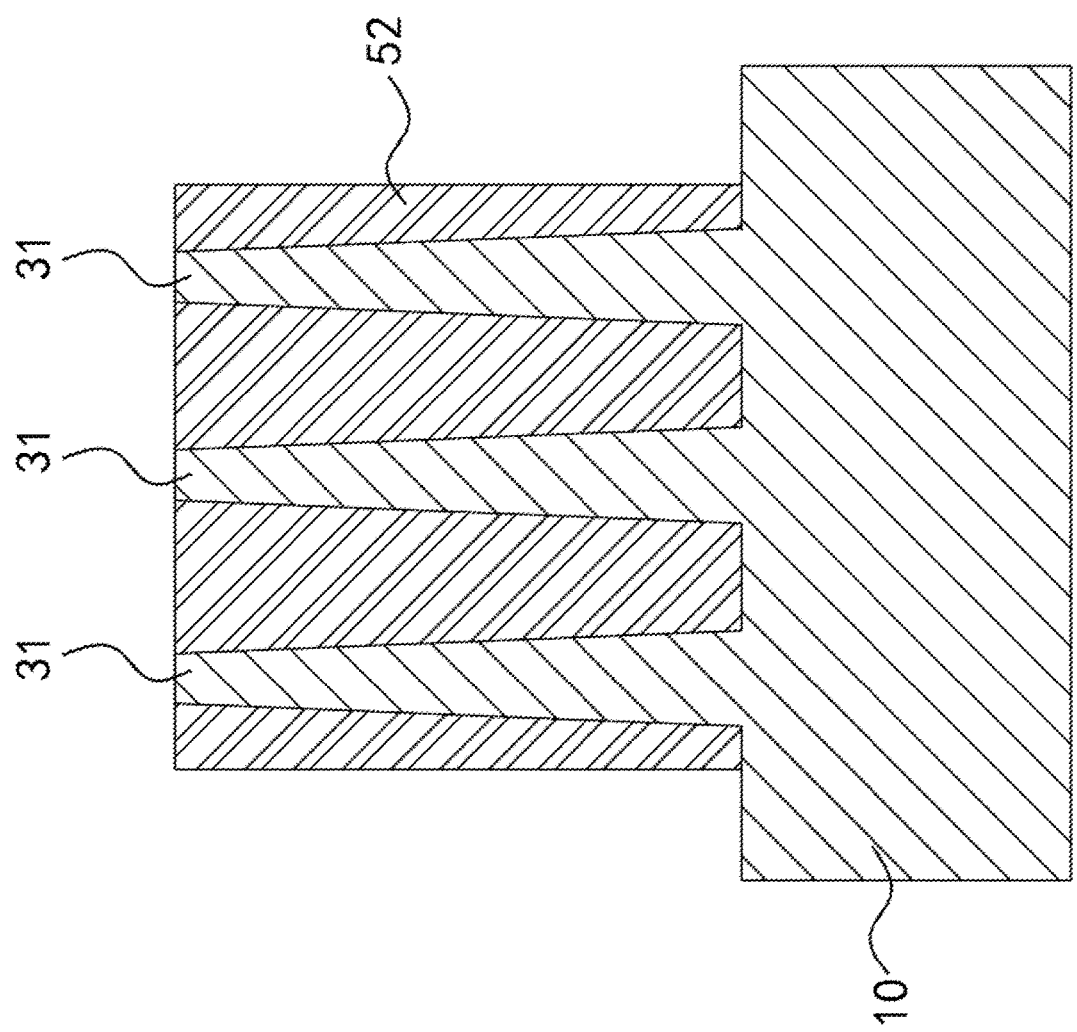
FIG. 3 is a schematic cross-sectional structure diagram of forming an initial protective layer along a second direction, according to a method for fabricating a semiconductor structure, according to an exemplary embodiment.

Specifically, as shown in FIG. 2 and FIG. 3, FIG. 2 is a schematic cross-sectional view of the substrate 10 and the semiconductor pillars 31 along the first direction. After the independent semiconductor pillars 31 are formed, an initial protective layer 52 is formed in the gaps of the semiconductor pillars 31, as shown in FIG. 3. FIG. 3 is a schematic cross-sectional view of the substrate 10 and the semiconductor pillars 31 along the second direction. It can be seen that the depth of cuts along the first direction in the substrate 10 is greater than the depth of cuts along the second direction. Optionally, the depth of cuts along the first direction in the substrate 10 may be 250 nm~350 nm, that is, the depth of the first trenches may be 250 nm~350 nm, and the depth of cuts along the second direction in the substrate 10 may be 100 nm~200 nm, that is, the depth of the second trench may be 100 nm~200 nm, thereby forming independent semiconductor pillars 31. At this time, the height of the semiconductor pillars 31 may be considered at 100 nm~200 nm.

Figure 4:
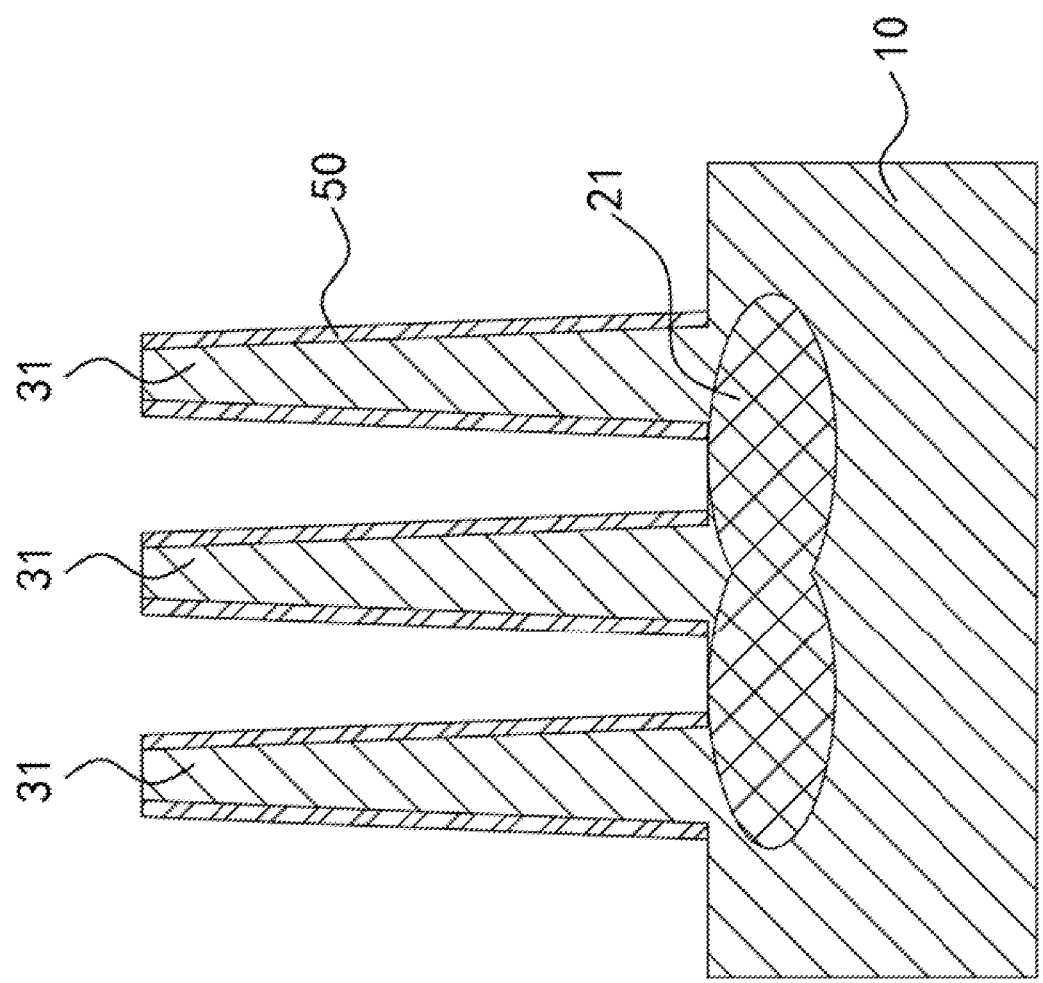
FIG. 4 is a schematic cross-sectional structure diagram of forming metal silicide along the first direction, by a method for fabricating a semiconductor structure, according to an exemplary embodiment.

The initial protective layer 52 is formed in the semiconductor pillar 31 by a physical vapor deposition process, a chemical vapor deposition process, or an atomic layer deposition process, and a portion of the initial protective layer 52 is removed by an etching process, thereby forming protective sidewalls 50 on the sidewalls of the semiconductor pillar 31, shown in FIG. 4, at this time, the initial protective layer 52 located under the semiconductor pillars 31 is not etched, and still fills the gap under the semiconductor pillars 31, and the thickness of the sidewall protection layer 50 can be 5 nm~15 nm And after the initial protective layer 52 is formed, a metal material is deposited in the substrate 10, so that the bit line metal silicide 21 is formed in the substrate 10, as shown in FIG. 4. Here, the initial protective layer 52 may be silicon oxynitride (SiON), silicon oxide (SiON), or the like.

It should be noted that there is an included angle between the first direction and the second direction, and further, the first direction is perpendicular to the second direction, so that each of the semiconductor pillars 31 has a rectangular column shape.

In one embodiment, the gate electrode 32 includes a gate barrier layer 321 and a gate metal layer 322 formed on each of the semiconductor pillar 31, and the gate barrier layer 321 realizes isolation of the semiconductor pillars 31 and the gate metal layer 322.

The gate barrier layer 321 may include a silicon oxide film ($SiO_2$) or a silicon nitride film (SiN), a silicon oxynitride film (SiON), or a high-k material film, wherein the high-k material is a material having a high dielectric constant. High-k materials such as aluminum oxide ($Al_2O_3$), tantalum oxide ($Ta_2O_5$), and hafnium oxide ($HfO_2$) can be formed individually or in combination, or alternatively by stacking a first high-k material and a second high-k material.

The gate metal layer 322 may include a conductive material like a metal layer. Polycrystalline silicon (poly-Si) can be used as the conductive material. Tungsten (W), tungsten nitride (WN), titanium (Ti), titanium nitride (TiN), molybdenum (Mo), cobalt (Co), nickel (Ni), copper (Cu) or aluminum (Al) can be used as a metal layer. Of course, these are only exemplarity materials, and in other examples, other similar materials with similar properties could be used as a conductive material such as a metal layer.

In one embodiment, forming the gate electrodes 32 on the sidewalls of the semiconductor pillars 31 includes: forming a sidewall protection layer 50 on the sidewalls of the semiconductor pillars 31; forming barrier layers 51 on the sidewall protective layers 50; partially etching the sidewall protective layer 50 to expose the upper and middle portions of the semiconductor pillars 31; sequentially forming gate barrier layers 321 and gate metal layers 322 on the middle portions of the semiconductor pillars 31. After the sidewall protective layer 50 is partially etched, a gap is formed between each barrier layer 51 and its semiconductor pillar 31, so that the gate barrier layer 321 and the gate metal layer 322 can be sequentially formed in the gap.

In one embodiment, a gate barrier layer 321 is formed on the upper sidewalls and the middle sidewalls of each of the semiconductor pillars 31, a gate metal layer 322 is formed on the gate barrier layer 321, then the gate metal layer 322 on the upper sidewalls of the gate barrier layer 321 is removed, to expose part of the gate barrier layer 321 and remove the gate barrier layer 321 on the upper sidewalls of the semiconductor pillar 31, so that the remaining gate barrier layer 321 and the gate metal layer 322 cover the middle part of the semiconductor pillar 31, that is, the remaining gate barrier layer 321 and the gate metal layer 322 serve as one gate electrode 32.

Figure 5:
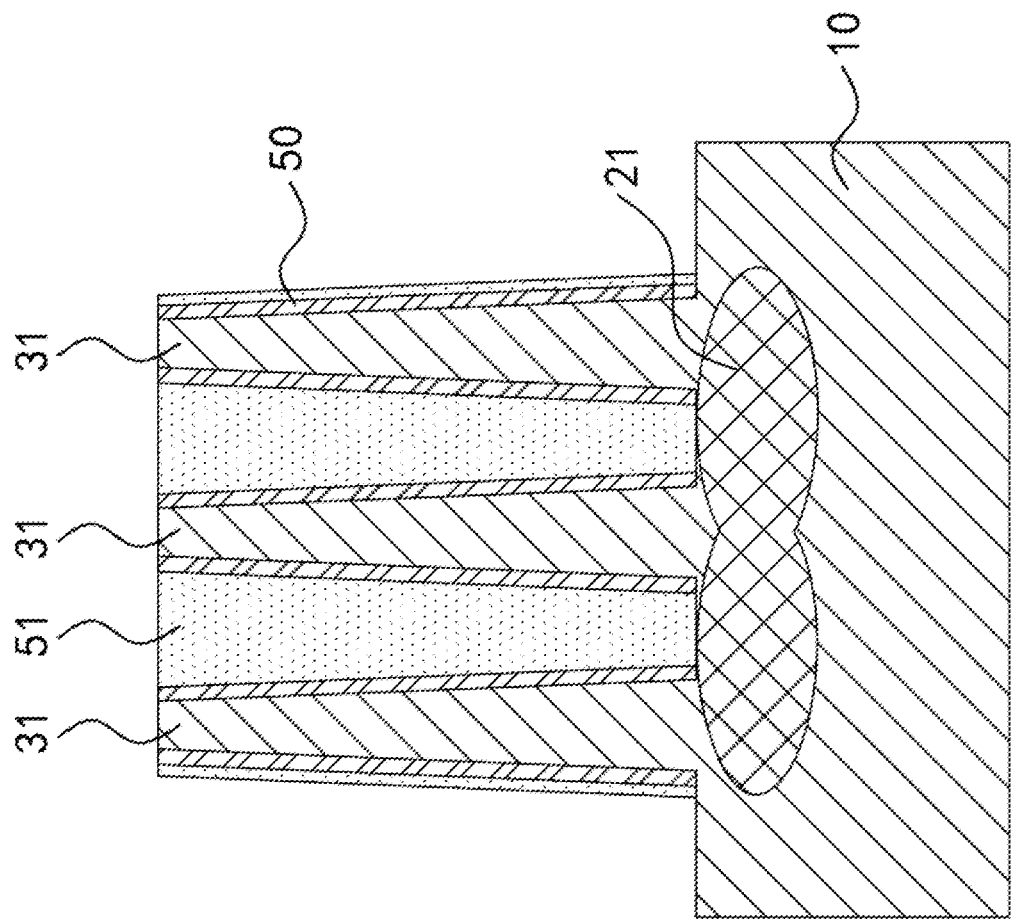
FIG. 5 is a schematic cross-sectional structure diagram of a barrier layer formed along the first direction by a method for fabricating a semiconductor structure, according to an exemplary embodiment.

Specifically, after an etching process removes part of the initial protective layer 52 to form the sidewall protective layer 50 shown in FIG. 4, the barrier layer 51 fills the gap formed by the sidewall protective layer 50, as shown in FIG. 5. The barrier layer 51 can be silicon nitride (SiN), silicon oxynitride (SiON), silicon nitride nitride (SiCN), etc. After the barrier layer 51 is formed, dry etching or chemical mechanical polishing (CMP) planarization process is performed to ensure the flatness of the top surface of the barrier layer 51. The formation of the barrier layer 51 may adopt a physical vapor deposition process, a chemical vapor deposition process, an atomic layer deposition process, or the like.

Figure 6:
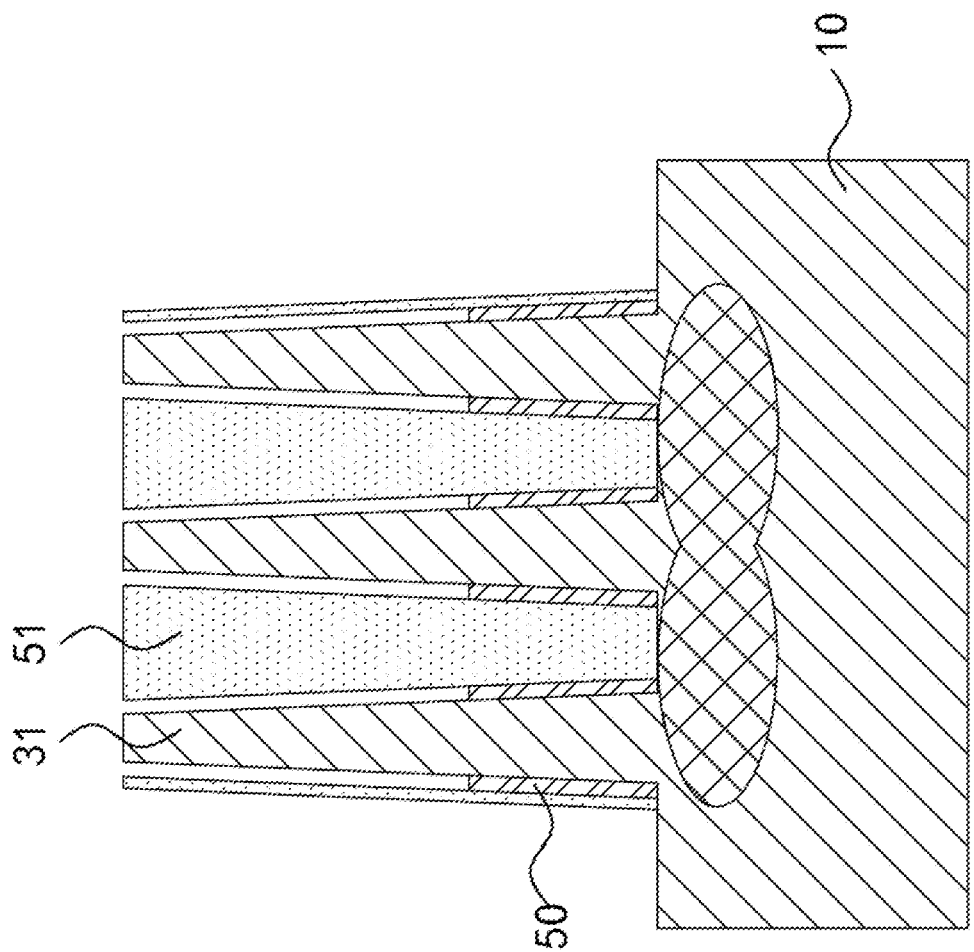
FIG. 6 is a schematic cross-sectional structure diagram of in which a barrier layer along the first direction is partially removed by a method for fabricating a semiconductor structure, according to an exemplary embodiment.
Figure 7:
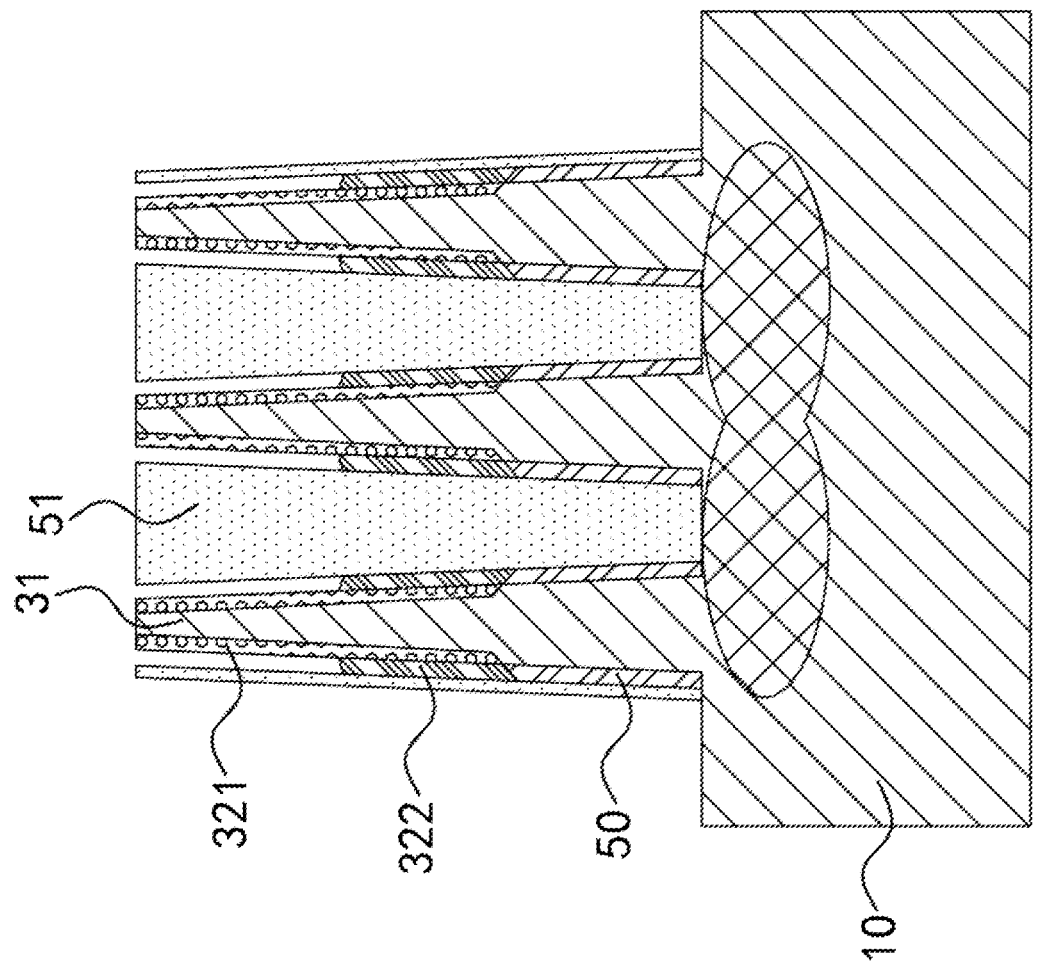
FIG. 7 is a schematic cross-sectional structure diagram of a gate metal layer formed along the first direction by a method for fabricating a semiconductor structure according to an exemplary embodiment.

The sidewall protective layer 50 is etched back to a depth of 80 nm to 120 nm, thereby forming the structure shown in FIG. 6. In this embodiment, the gate barrier layer 321 may be formed by thermal oxidation, and the gate metal layer 322 may be formed by deposition. At this time, the gate barrier layer 321 covers the upper and middle portions of the semiconductor pillar 31, and the gate metal layer 322 covers the gate barrier layer 321. After the gate metal layer 322 is etched back, the gate barrier layer 321 on the upper part of the semiconductor pillar 31 is exposed, as shown in FIG. 7, or the gate barrier layer 321 on the upper portion of the semiconductor pillar 31 is removed together while the gate metal layer 322 is etched back, or, after the etch back of the gate metal layer 322 is completed, the gate barrier layer 321 is etched back to expose the upper portion of the semiconductor pillars 31. At this time, the height of the exposed upper portion of the semiconductor pillars 31 may be 20 nm to 60 nm, which is the height of the subsequently formed source region 311 or the drain region 312.

In one embodiment, before performing doping implantation on the upper and lower portions of the semiconductor pillars 31, the method further includes: removing the sidewall protective layer 50 and the blocking layer 51, thereby exposing the gate metal layer 322, so that each independently formed gate electrodes 32 are surrounded by the semiconductor pillars 31.

In one embodiment, forming the sidewall protective layer 50 includes: forming an initial protective layer 52 on the substrate 10 so that the initial protective layer 52 buries the semiconductor pillars 31, removing part of the initial protective layer 52, the remaining protective layer 52 is used as the sidewall protective layer 50. At this time, the initial protective layer 52 fills the lower part of the semiconductor pillars 31, that is, the first trench is filled with the initial protective layer 52.

In one embodiment, after dopant implanting the upper and lower parts of the semiconductor pillars 31, the method further includes: forming a termination protective layer 53 between adjacent semiconductor pillars 31 to bury the semiconductor pillars 31 and the gate electrodes 32; therefore, the termination protective layer 53 is located on the initial protective layer 52 on the lower part of the semiconductor pillars 31, so that the initial protective layer 52 and the termination protective layer 53 can reliably protect the semiconductor pillars 31 and the gate electrodes 32.

Figure 8:
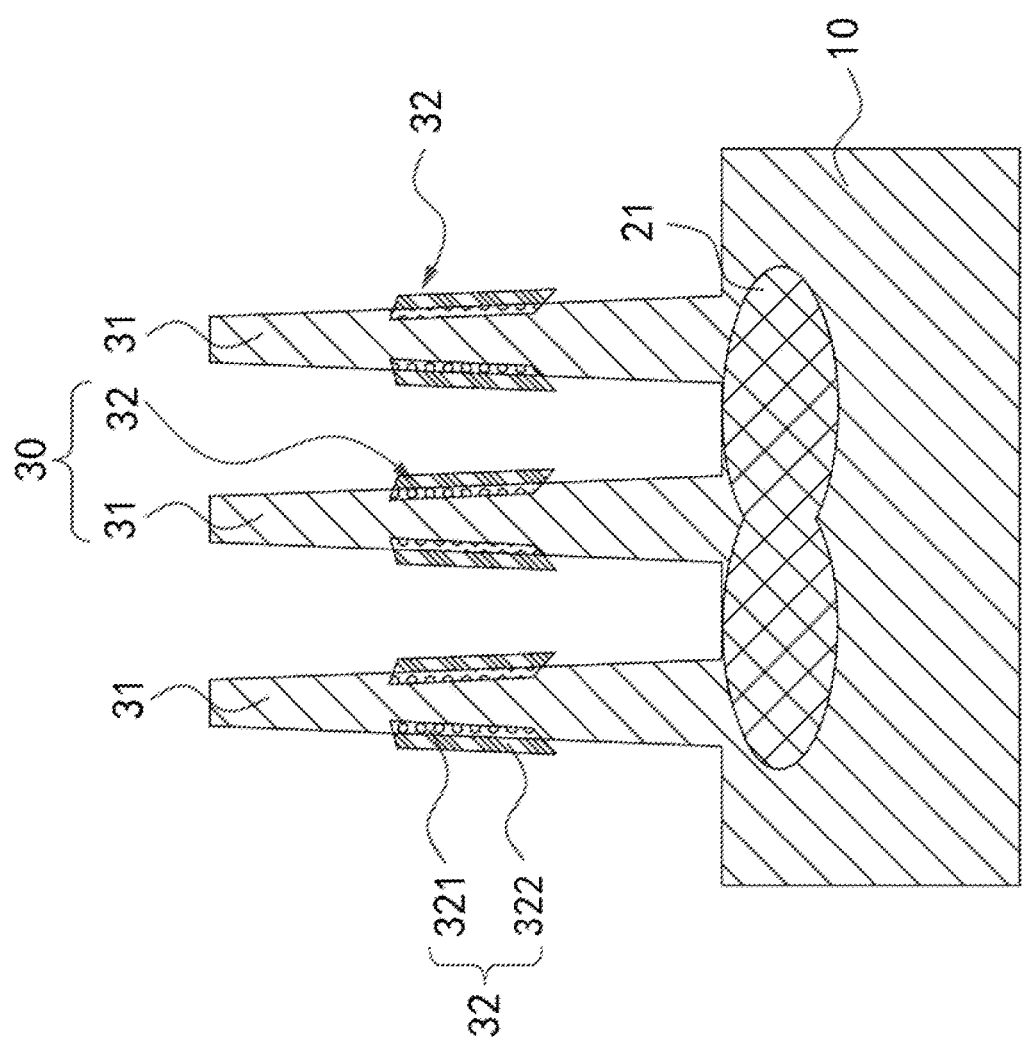
FIG. 8 is a schematic cross-sectional structure diagram showing gates formed along the first direction by a method for fabricating a semiconductor structure according to an exemplary embodiment.
Figure 9:
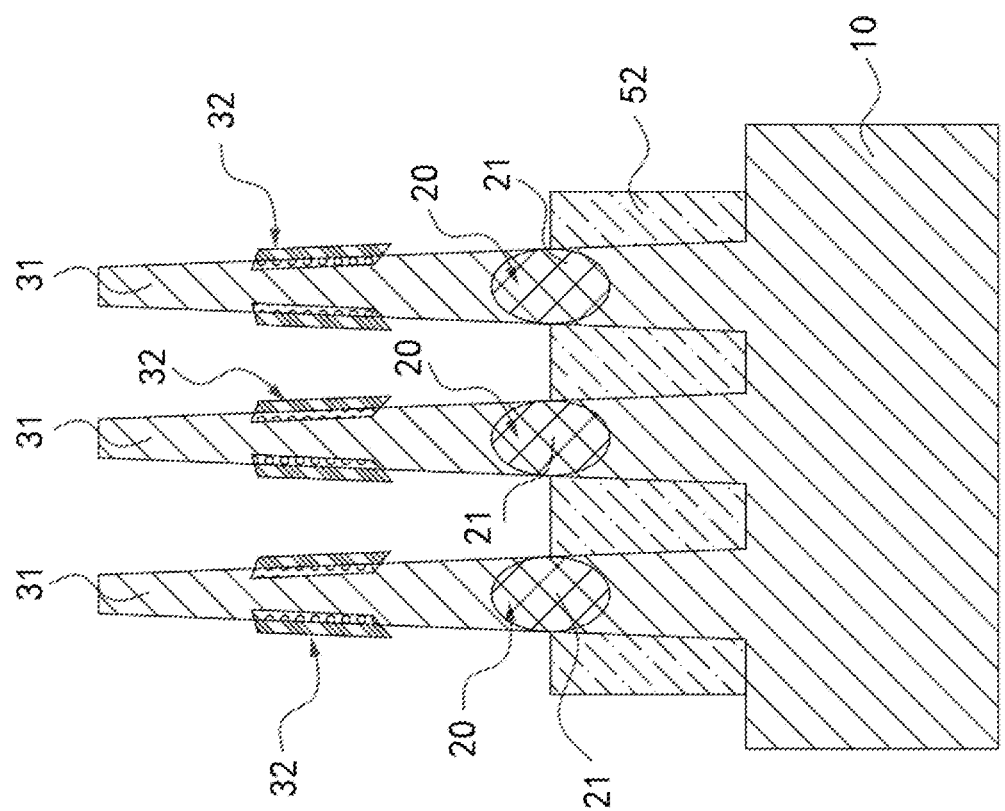
FIG. 9 is a schematic cross-sectional structure diagram showing gates formed along the second direction by a method for fabricating a semiconductor structure, according to an exemplary embodiment.

In one embodiment, the sidewall protective layer 50 and the barrier layer 51 are removed by an ion beam etching process to form the structure shown in FIG. 8 and FIG. 9, wherein etching the sidewall protective layer 50 under the gate metal layer 322 can be accomplished by increasing the etching isotropy and prolonging the etching time. FIG. 8 is a schematic cross-sectional view along the first direction, and FIG. 9 is a schematic cross-sectional view along the second direction. It can be seen that after the gate electrodes 32 are formed, gaps between the lower bottom portions of the semiconductor pillars 31 are also filled with an initial protective layer 52.

Figure 10:
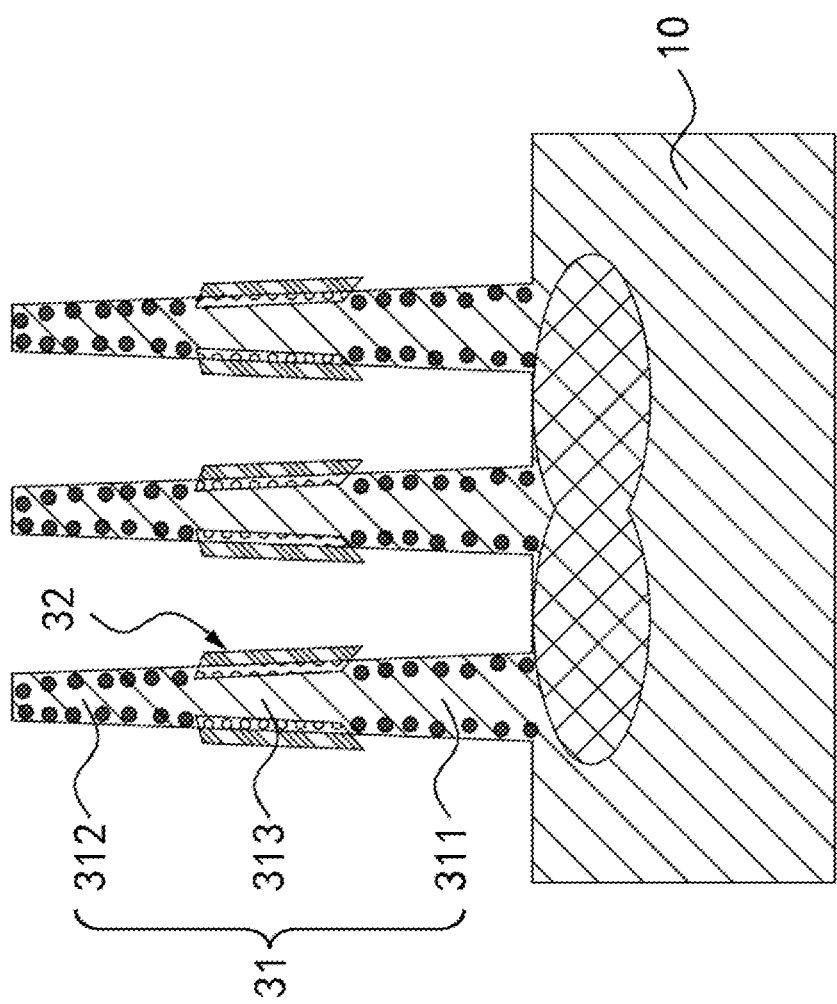
FIG. 10 is a schematic cross-sectional structure diagram of forming a source region and a drain region along the first direction, by a method for fabricating a semiconductor structure, according to an exemplary embodiment.
Figure 11:
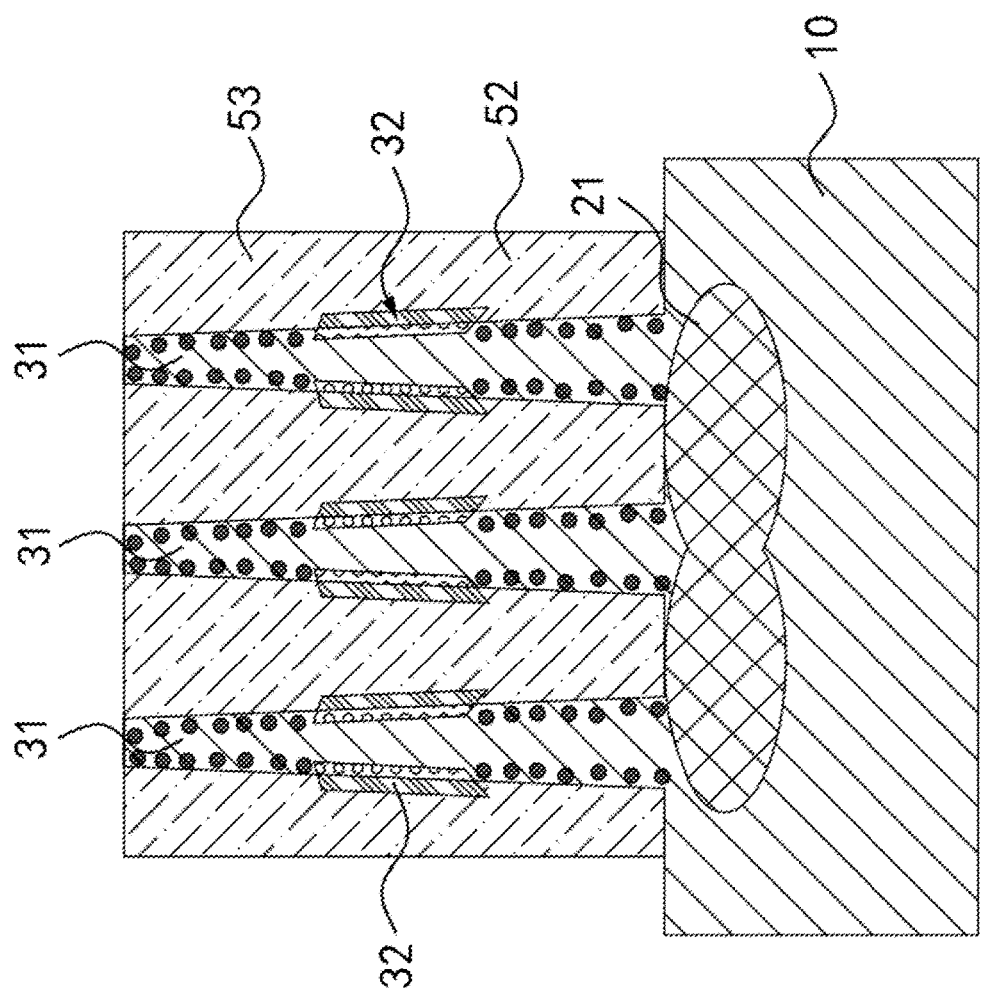
FIG. 11 is a schematic cross-sectional structure diagram of forming a termination protection layer along the first direction, according to a method for fabricating a semiconductor structure, according to an exemplary embodiment.
Figure 12:
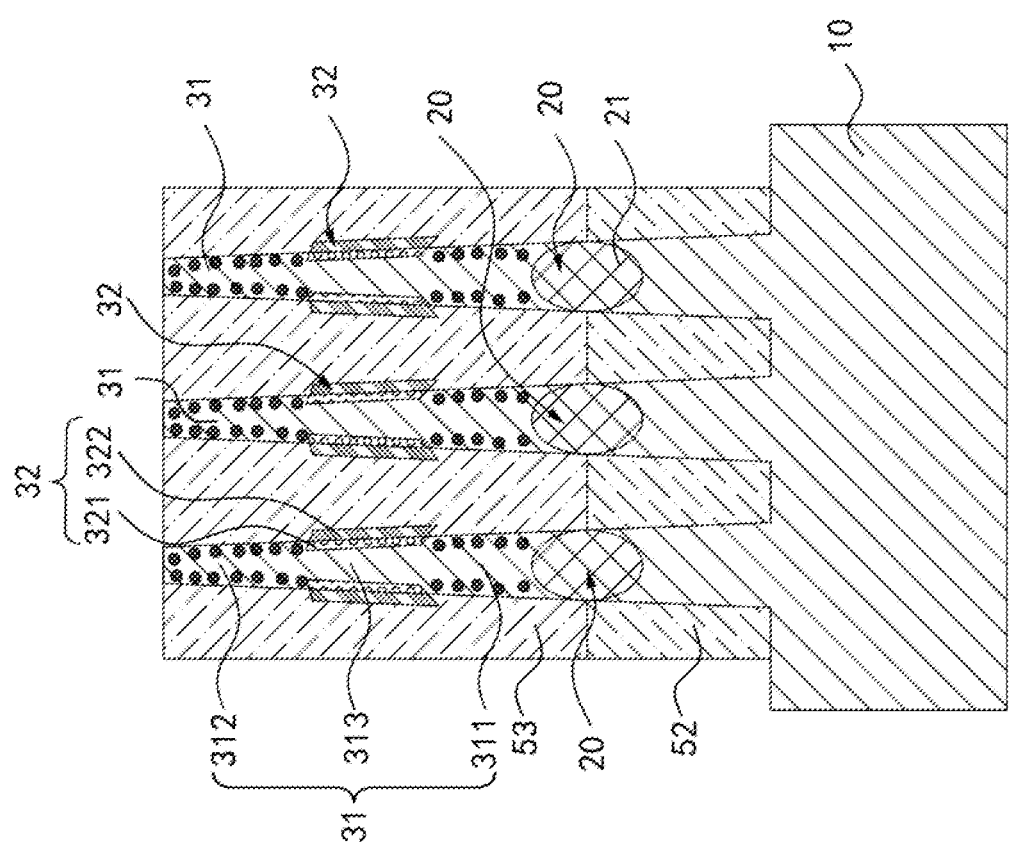
FIG. 12 is a schematic cross-sectional structure diagram of forming a termination protection layer along the second direction by a method for fabricating a semiconductor structure, according to an exemplary embodiment.

The upper and lower portions of the semiconductor pillars 31 are then doped and annealed by plasma doping, thereby forming the structure shown in FIG. 10. Finally, the semiconductor pillars 31 and the gate electrodes 32 are buried by the termination protective layer 53, as shown in FIG. 11 and FIG. 12. The materials of the initial protective layer 52 and the termination protective layer 53 may be the same, for example, the initial protective layer 52 and the termination protective layer 53 may be silicon oxynitride (SiON), silicon oxide (SiON), or the like.

The fabrication of the semiconductor structure according to the embodiment of the present invention does not involve any additional doping on the substrate before forming the bit line metal silicide, and after completing the fabrication of the bit line metal silicide, a self-aligned gate process is fabricated, and all silicide (sidewall protective layers) and nitride (barrier layers) are removed by plasma etching, the source and drain regions are doped and annealed by plasma doping using the gate electrodes as masks, and finally the structure is backfilled with silicon oxide (terminating protective layer), to form vertical transistors.

An embodiment of the present invention also provides a semiconductor structure, including the semiconductor structure obtained by the above-mentioned semiconductor manufacturing method, so the vertical transistors 30 are formed.

In one embodiment, the unit cell size of each of the semiconductor pillars 31 on the substrate 10 is greater than or equal to 4 times the square of the smallest feature size.

The fabricated semiconductor structure in this embodiment can form the bit lines 20 and the word line (i.e. the gate) with the minimum feature size F according to the relevant fabrication process. The line spacings between the adjacent bit lines 20 and the adjacent word lines formed are also greater than or equal to the minimum feature size F, then the width dimension of a vertical transistor in the direction perpendicular to the bit line is 2F, and the width dimension in the direction perpendicular to the word line is also 2F. Thus, the unit cell area of each of the vertical transistor reaches $4F^2$ (2F*2F). That is, the unit cell area of the vertical transistor is equal to or greater than four times the square of the minimum feature size.

"Unit cell area" refers to the unit cell area for a memory cell that is required to be available on the substrate, which specifically includes: the area that a memory cell actually needs to occupy on the substrate, and the space that needs to be reserved between adjacent storage units. For example, the area occupied by N memory transistors on the substrate is M, then the unit cell area of one memory transistor on the substrate is N/M.

The semiconductor structure in this embodiment is a gate-all-around (GAA) transistor-based $4F^2$ vertical DRAM memory cell that includes buried bit lines with metal silicide, word lines precisely surrounding silicon nanowires, and silicon nanowires with correct NPN or PNP doping.

Other embodiments of the invention will readily occur to those skilled in the art upon consideration of the specification and practice of the invention disclosed herein. The present invention is intended to cover any variations, uses or adaptations of the present invention which follow the general principles of the invention and include common knowledge or conventional techniques in the technical field not disclosed by the present invention. The specification and example embodiments are to be regarded as exemplary only, with the true scope and spirit of the invention being indicated by the appended claims.

It should be understood that the present invention is not limited to the precise structures described above and illustrated in the accompanying drawings, and that various modifications and changes may be made without departing from its scope. The scope of the present invention is limited only by the appended claims.

The invention claimed is:

1. A method of fabricating a semiconductor structure, comprising:
   provide a substrate;
   forming a semiconductor pillar comprising of one type of dopants on the substrate;
   forming a gate electrode on middle sidewalls of the semiconductor pillar;
   performing doping implantation to the semiconductor pillar, wherein the doping implantation is targeted on upper and lower portions of the semiconductor pillar to form source regions and drain regions, and wherein the doping implantation comprises an opposite type of dopants from the one type of dopants of the semiconductor pillar;

wherein a bit line is formed in the substrate, and wherein the semiconductor pillar is located on the bit line, wherein the method further comprises:

after forming the semiconductor pillar and before forming the gate electrode, a bit line metal silicide of the bit line is formed within the substrate.

2. The method for fabricating the semiconductor structure according to claim 1, wherein if the semiconductor pillar is made of a p-type semiconductor material, an n-type doping implantation is performed on the upper and lower portions of the semiconductor pillar;

and wherein if the semiconductor pillar is of an n-type semiconductor material, a p-type doping implants is performed on the upper and lower portions of the semiconductor pillar.

3. The method for fabricating the semiconductor structure according to claim 1, wherein the upper and lower portions of the semiconductor pillar are doped by plasma doping.

4. The method for fabricating the semiconductor structure according to claim 3, further comprising:

after the upper and lower portions of the semiconductor pillar are doped with plasma doping, an annealing treatment is performed.

5. The method for fabricating the semiconductor structure according to claim 1, wherein the gate electrode is Gate-All-Around (GAA) gate.

6. The method for fabricating the semiconductor structure according to claim 1, wherein the method further comprises:

before forming the bit line metal silicide, a sidewall protection layer is formed on the sidewall of the semiconductor pillar.

7. The method for fabricating the semiconductor structure according to claim 6, wherein after forming the sidewall protection layer, a metal material is deposited in the substrate and annealed to form the bit line metal silicide.

8. The method for fabricating the semiconductor structure according to claim 1, wherein a first trench and a second trench are formed on the substrate along a first direction and a second direction respectively, wherein the first trench and the second trench combine to form independent semiconductor pillars, wherein the bit lines extend along the first direction in the substrate, and wherein the semiconductor pillars are located on the bit lines; and wherein a depth of the first trench is greater than a depth of the second trench.

9. The method for fabricating the semiconductor structure according to claim 8, wherein the first direction is perpendicular to the second direction in the substrate.

10. The method for fabricating the semiconductor structure according to claim 1, wherein the gate electrode comprises a gate barrier layer and a gate metal layer sequentially formed on the semiconductor pillar.

11. The method for fabricating the semiconductor structure according to claim 10, wherein forming the gate electrodes on the sidewalks of the semiconductor pillars comprises:

forming a sidewall protective layer on the sidewall of the semiconductor pillar;

forming a barrier layer on the sidewall protective layer; and partially etching the sidewall protective layer to expose upper and middle portion of the semiconductor pillar;

wherein the gate barrier layer and the gate metal layer are formed on the middle portion of the semiconductor pillar.

12. The method for fabricating the semiconductor structure according to claim 11, wherein the gate barrier layer is formed on the upper sidewall and the middle sidewall of the semiconductor pillar, and wherein the gate metal layer is formed on the gate barrier layer, wherein the method further comprises removing the gate metal layer from the upper sidewall of the gate barrier layer, and removing the gate barrier layer from the upper sidewall of the semiconductor pillar, wherein a remaining gate barrier layer and the gate metal layer are used as the gate electrode.

13. The method for fabricating the semiconductor structure according to claim 11, wherein before the doping implantation is performed on the upper portion and the lower portion of the semiconductor pillar, the method further comprises:

removing the sidewall protective layer and the gate barrier layer.

14. The method for fabricating the semiconductor structure according to claim 13, wherein the sidewall protective layer and the gate barrier layer are removed by an ion beam etching process.

15. The method for fabricating the semiconductor structure according to claim 11, wherein forming the sidewall protective layer comprises:

forming an initial protective layer on the substrate, wherein the initial protective layer buries the semiconductor pillar; and removing a part of the initial protective, wherein the initial protective layer covering the semiconductor pillar serves as the sidewall protective layer.

16. The method for fabricating the semiconductor structure according to claim 15, wherein after performing doping implantation on the upper portions and the lower portions of the semiconductor pillar, the method further comprises:

forming a termination protective layer between the semiconductor pillar to bury the semiconductor pillar and the gate electrodes;

wherein, the termination protective layer is located on the initial protection layer on the lower portions of the semiconductor pillars.

17. A semiconductor structure, fabricated by the method according to claim 1.

* * * * *